US006764805B2

(12) United States Patent
Piccinino, Jr. et al.

(10) Patent No.: US 6,764,805 B2
(45) Date of Patent: Jul. 20, 2004

(54) COATING APPARATUS HAVING A CASCADE WALL AND METERING BLADE, AND A CLEANING AND RECIRCULATION ARRANGEMENT FOR THE COATING APPARATUS

(75) Inventors: Ralph L. Piccinino, Jr., Rush, NY (US); Kevin H. Blakely, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/138,996

(22) Filed: May 3, 2002

(65) Prior Publication Data

US 2002/0157603 A1 Oct. 31, 2002

Related U.S. Application Data

(62) Division of application No. 09/470,639, filed on Dec. 22, 1999, now Pat. No. 6,423,138.

(51) Int. Cl.[7] .............................. G03F 7/00; B05C 1/00

(52) U.S. Cl. .................... 430/270.1; 430/496; 118/203; 118/261; 118/602

(58) Field of Search .............................. 430/270.1, 496; 118/203, 261, 602

(56) References Cited

U.S. PATENT DOCUMENTS

| | | | | |
|---|---|---|---|---|
| 3,292,577 A | * 12/1966 | Cressey, Jr. et al. | ........ | 118/603 |
| 3,335,701 A | 8/1967 | Verkinderen et al. | | |
| 3,486,482 A | 12/1969 | Hunger | | |
| 3,561,401 A | * 2/1971 | Ford et al. | .................. | 118/249 |
| 3,687,109 A | * 8/1972 | Egnaczak | ................... | 399/239 |
| 3,897,578 A | 7/1975 | Kanda et al. | | |
| 4,155,637 A | 5/1979 | Witte et al. | | |
| 4,242,444 A | * 12/1980 | Habu et al. | ................. | 430/510 |
| 4,737,810 A | 4/1988 | Kobayashi et al. | | |
| 4,738,877 A | * 4/1988 | Krautzberger | ............. | 427/356 |
| 5,450,155 A | 9/1995 | Carmen | | |
| 5,481,328 A | 1/1996 | Verhoest et al. | | |
| 5,797,318 A | 8/1998 | Taylor et al. | | |

FOREIGN PATENT DOCUMENTS

EP 0 339 702 A1 11/1989

* cited by examiner

*Primary Examiner*—Mark F. Huff
*Assistant Examiner*—Amanda Walke
(74) *Attorney, Agent, or Firm*—David A. Novais

(57) ABSTRACT

An apparatus and method for applying at least one solution of a predetermined viscosity to photosensitive material. The apparatus includes at least an application roller that applies the coating solution onto the photosensitive material. The application roller partially extends into a solution tray of the coating apparatus and is partially submerged in solution in the solution tray. In an arrangement of the present invention, a cascade wall and metering blade are positioned within the solution tray so as to define a first section at which solution enters the tray, and a second section which receives solution that spills over from the first section and includes a port which leads coating solution back to a coating solution tank for recycling or leads cleaning solution to drain. The apparatus further includes a washing arrangement that washes the coating apparatus in an efficient manner. The washing arrangement includes a retractable scrubber bar arrangement that moves away from the application roller when the coating apparatus is in a coating mode of operation and is movable toward the application roller by way of brushes in a cleaning mode of operation. The apparatus and method further includes a recirculation system that alternatively supplies coating solution to the coating solution tray and cleaning solution to both the solution tray and washing arrangement.

5 Claims, 3 Drawing Sheets

COATING APPARATUS HAVING A CASCADE WALL AND METERING BLADE, AND A CLEANING AND RECIRCULATION ARRANGEMENT FOR THE COATING APPARATUS

This is a divisional application of U.S. Ser. No. 09/470,639 filed Dec. 22, 1999 now U.S. Pat. No. 6,423,138.

BACKGROUND OF THE INVENTION

A coating apparatus as described in, for example, U.S. Pat. No. 5,984,539 generally applies a solution of a predetermined viscosity to photosensitive material, preferably processed photosensitive material, to form a protective overcoat on at least one surface of the photosensitive material. In order to apply a protective coating to an emulsion surface of a photosensitive material, control of the thickness, uniformity and laydown amount of the coating being applied is needed in order to apply for adequate protection against at least moisture. The control is needed for several reasons: 1) the protective coating must be applied in a manner that assures that the surface is uniformly coated, so that the coating can provide adequate protection to the entire surface; 2) the thickness of the coating must be controlled because if the coating is too thick, it could cause cracking, due to non-uniform drying; 3) a thick coating could dull the surface and underlying image of the photographic print; and 4) the coating solutions can be of different viscosities.

Generally, a coating apparatus as disclosed in, for example, U.S. application Ser. No. 08/082,957 filed May 21, 1998, which discloses one type of coating apparatus, utilizes an applicator roller for applying a solution of predetermined viscosity to the surface of photosensitive material. The solution is to be applied in a manner that provides for an even thickness of solution on the photosensitive material. These coating solutions tend to be such that over a period of time they can harden within the coating apparatus. If components, such as the rollers, of the coating apparatus become dirty with excess coating solution, they can leave artifacts on the photosensitive material. The cleaning of these components affects the efficiency of the coating apparatus by increasing the down time of the apparatus. Therefore, it is advantageous to provide for a coating apparatus that is capable of applying an even coating on the photosensitive material, and which further includes a mechanism for quickly and efficiently cleaning the components of the coating apparatus.

SUMMARY OF THE INVENTION

The present invention provides for a novel apparatus and method that can apply a solution of a predetermined viscosity to at least one surface of photosensitive material, preferably processed photosensitive material, prior to the final drying of the photosensitive material, to form a protective overcoat. In the present invention, the solution can be uniformly applied to the surface of the photosensitive material at a specific thickness.

The present invention further provides for a cleaning arrangement, which is capable of maintaining the components of the coating apparatus clean, so as to minimize any artifacts on the photosensitive material.

The present invention further provides for a recirculation system which is capable of alternately supplying coating solution and/or cleaning solution to the coating apparatus in an efficient manner, so as to minimize down time of the coating apparatus during a cleaning operation.

The present invention provides for a coating apparatus for applying a coating solution to photosensitive material. The coating apparatus comprises a support structure; first and second rollers mounted on the support structure so as to form a nip therebetween for the passage of photosensitive material therethrough; a tray position relative to one of the first and second rollers such that the one roller partially extends into the tray; and a wall having a blade extending therefrom. The blade extends to a surface of the one roller, while the wall and blade are positioned in the tray so as to divide the tray into a first section and a second section. The first section receiving coating solution therein such that the one roller is at last partially submerged in the coating solution. The second section defines a spillover basin that catches coating solution that spills over the blade from the first section.

The present invention further provides for a cleaning assembly for cleaning a coating apparatus, in which the coating apparatus has at least one application roller at least partially positioned within a solution tray of the coating apparatus. The cleaning assembly comprises a washing arrangement positioned relative to the application roller to supply cleaning solution onto at least the application roller; and a recirculation system that delivers cleaning solution to the washing arrangement and the solution tray.

The present invention further provides for a method of coating photosensitive material with a coating solution. The method comprises the steps locating an application roller at least partially within a solution tray of a coating apparatus; supplying a coating solution to the solution tray such that the application roller is partially submerged in the coating solution; metering the coating solution on the application roller with a metering blade, as the application roller is rotated while at least being partially submerged in the coating solution; and passing a photosensitive material through a nip between the application roller and a drive roller. The nip is downstream of the metering blade with respect to a direction of rotation of the application roller, such that the coating solution is applied to a surface of the photosensitive material as the photosensitive material passes through the nip.

The present invention further provides for a method of cleaning a coating apparatus, in which the coating apparatus has an application roller at least partially positioned within a solution tray of the coating apparatus. The method comprises the steps of positioning a washing arrangement relative to the application roller so as to supply cleaning solution through the washing apparatus onto at least a surface of the application roller; and supplying cleaning solution to the washing arrangement and the solution tray.

The present invention further provides for a coating apparatus for applying a coating solution to at least one surface of the photosensitive material. The coating apparatus comprises a support structure; an application roller mounted to the support structure; and a tray located relative to the application roller so that the application roller at least partially extends into the tray. The apparatus further comprises a wall positioned with respect to the tray so as to divide the tray into first and second sections. One of the first and second sections is adapted to receive a coating solution therein, with the application roller being partially submerged in the coating solution. The other one of the first and second sections defines a spillover basin to catch coating solution that spills over from the one section.

The present invention further provides for a processing system that comprises a processor for processing photosensitive material; and a coating apparatus for applying at least one coating solution onto a surface of the processed photosensitive material. The coating apparatus comprises a support structure; an application roller mounted to the support structure; a tray positioned relative to the application roller such that the application roller extends into the tray; and a wall having a blade extending therefrom. The blade extending to a surface of the application roller, and the wall is positioned in the tray so as to divide the tray into a first section and a second section. The first section holds one of a coating solution or a cleaning solution supplied thereto so that the application roller is partially submerged into the one solution. The second section defines a spill-over basin to catch solution from the first section which spills over the metering blade.

The present invention further provides for an apparatus for coating at least one surface of a photosensitive material with a coating solution. The apparatus comprises an application roller adapted to apply coating solution onto a surface of photosensitive material; a first holding area for solution located relative to the application roller, so that the application roller extends at least partially therein and the application roller is at least partially submerged in solution in the first holding area. The solution is applied to the application roller at the first holding area. The apparatus further comprises a second holding area for solution positioned relative to the first holding area so as to catch excess solution that spills over from the first holding area.

DETAILED DESCRIPTION OF THE INVENTION

Figure 1A:
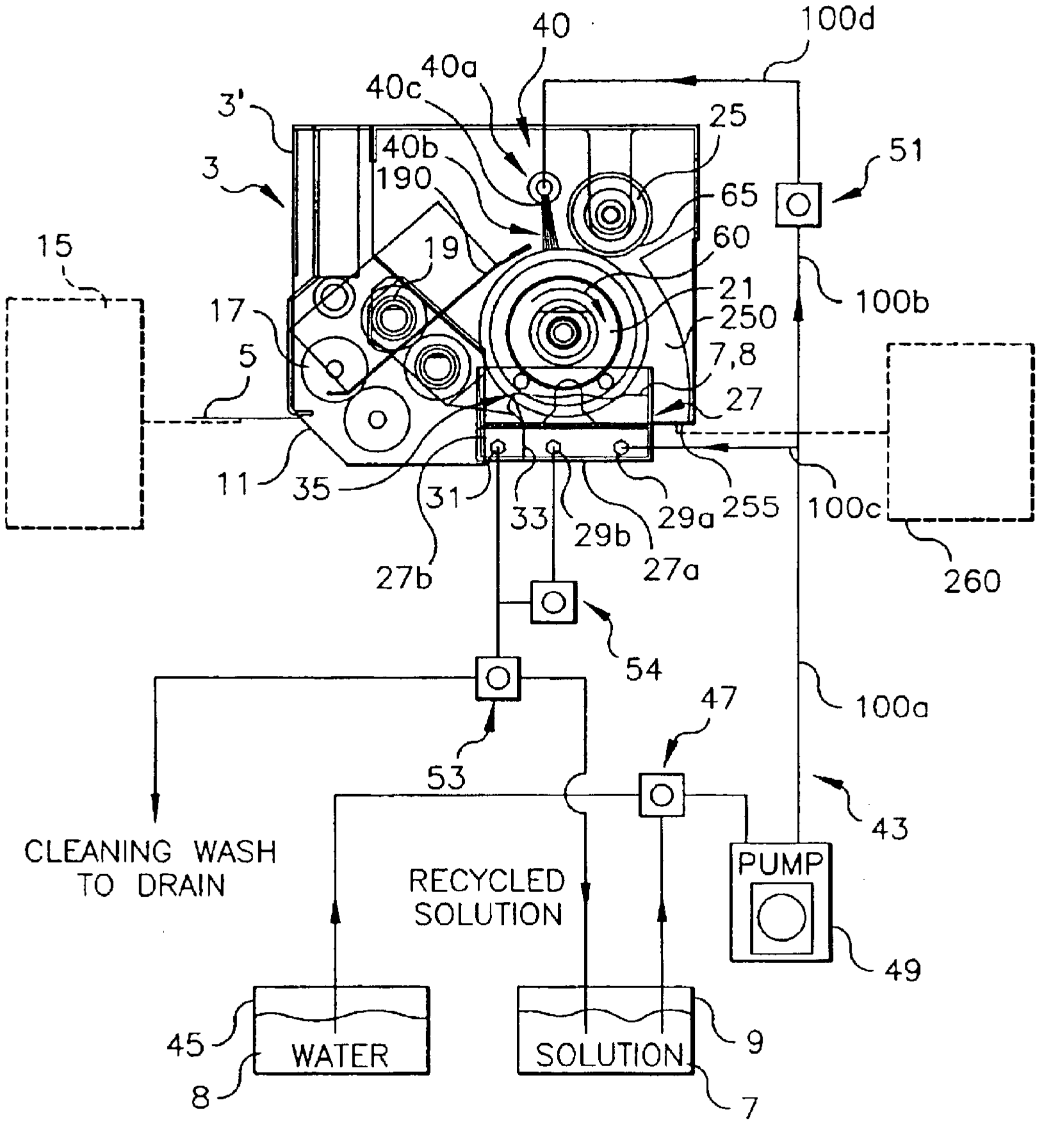
FIG. 1A illustrates a schematic view of the coating apparatus, recirculation arrangement and cleaning arrangement in accordance with the present invention.
Figure 1B:
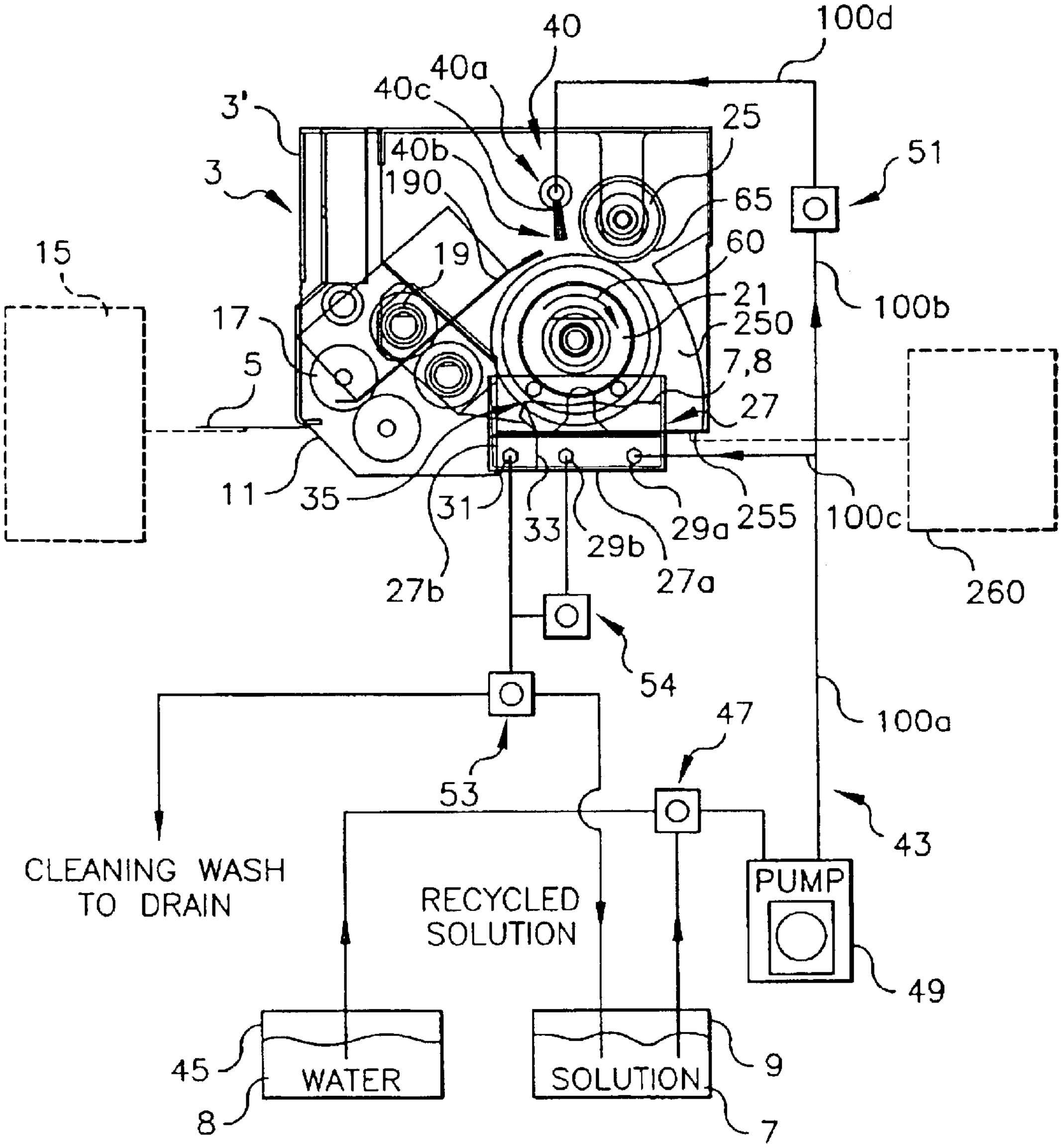
FIG. 1B is a view similar to FIG. 1A but with the cleaning arrangement retracted.

Referring now to the drawings, wherein like reference numerals represent identical or corresponding parts throughout the several view, FIGS. 1A and 1B schematically illustrate a coating apparatus 3 for applying a layer of coating solution 7 of a predetermined viscosity to photosensitive material 5 prior to a drying of photosensitive material 5. In the system of the present invention, coating solution 7 can be held in a coating solution tank 9, while photosensitive material 5 is conveyed into coating apparatus 3 in a configuration where the emulsion side faces downward. Photosensitive material 5 can be a processed photosensitive material and can be in the form of a photographic print, a web, a cut sheet or film. Coating solution 7 when dry will form a protective coating on photosensitive material 5 which exhibits at least moisture-proof properties. Coating apparatus 3 can be added to the end of an existing processing device as an accessory, can be built in as part of a new processor or retrofit into an existing processor.

With respect to the property of coating solution 5, reference is made to copending U.S. Pat. Nos. 5,984,539; 5,905,924 and 5,875,370. Since coating solution 5 is to be applied in a minilab or photographic processing center, water based solutions that are substantially free of volatile organic compounds are preferred. However, it is recognized that numerous coating solutions can be utilized, and that the type of coating solution applied is based on design considerations in view of the desired viscosity and water-proofing properties of the applied coating.

Figure 2:
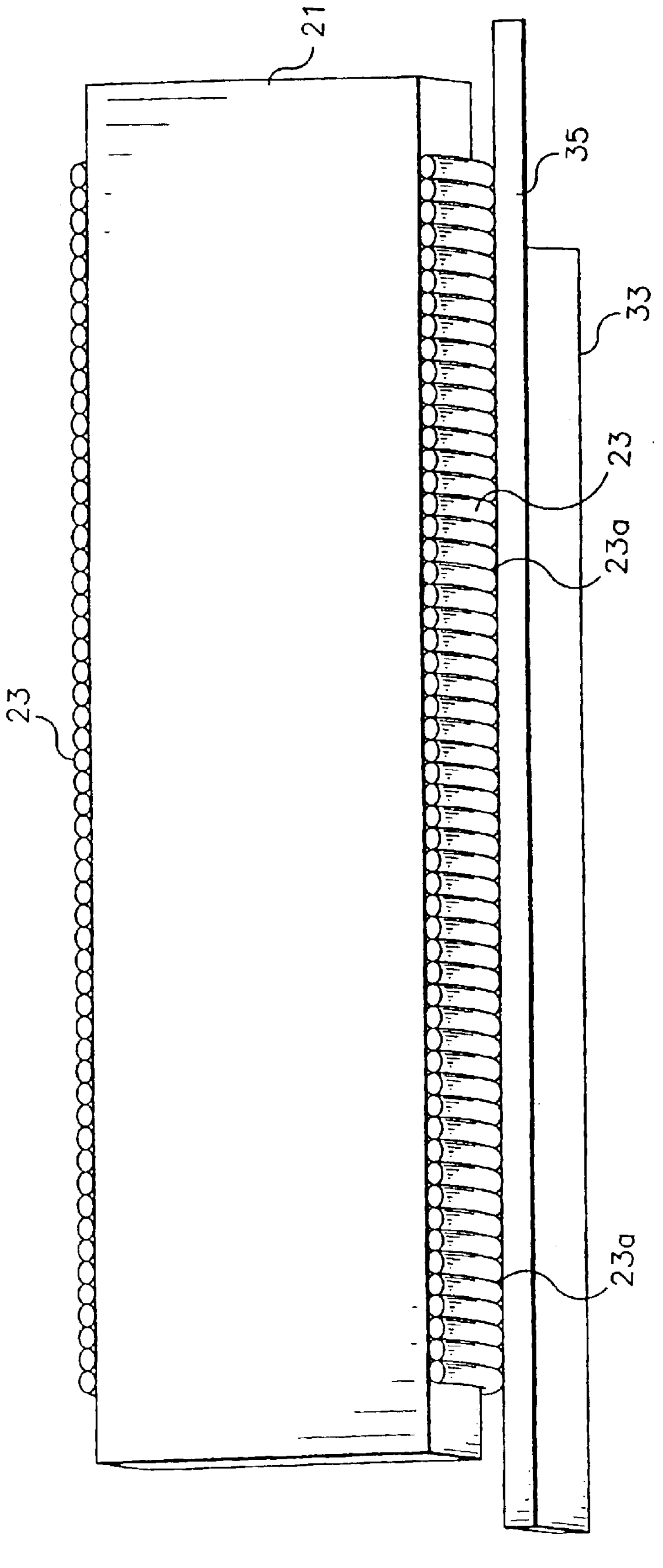
FIG. 2 is a sectional view of a wire application roller, metering blade and cascade wall in accordance with the present invention.

As illustrated in FIG. 1, coating apparatus 3 includes a module 3' and a photosensitive material entry port 11 through which photosensitive material 5 enters. In the system of the present invention, coating apparatus 3 can receive processed photosensitive material which exits the last station of a processing assembly 15. Processing assembly 15 could be part of a known processing system which includes a series of tanks that include developer solution, bleach solution, fixer solution and washing solution; or a combination of bleach/fix solution and wash/stabilizer solution. Each of the tanks would thereby represent steps in the developing process. In a feature of the present invention, entry port 11 can be positioned so as to permit coating apparatus 3 to be an in-line coating apparatus. Therefore, entry port 11 would be in line with an output of processing assembly 15, to directly receive processed photosensitive material from the last tank of the processing assembly. Coating apparatus 3 includes feed rollers 17 and squeegee rollers 19 which upwardly convey photosensitive material 5, emulsion side down, towards an application roller 21 of coating apparatus 3. A guide 190 can be utilized to guide photosensitive material 5 toward application roller 21. Application roller 21 can be a wire roller as shown in FIG. 2 in which a wire or wires 23 having spaces 23*a* therebetween is wrapped around roller 21. Coating apparatus 3 can further include a pinch drive roller 25 located relative to application roller 21 so as to define a nip 65 therebetween.

In a feature of the present invention, a solution tray 27 is provided below application roller 21 so that application roller 21 partially extends into solution tray 27. In this way, application roller 21 can be partially submerged in solution within solution tray 27. Solution tray 27 includes a solution tray entry port 29*a*, a first solution tray exit port 29*b* and a second solution tray exit port 31. A feature of solution tray 27 it that is includes a wall 33 in the form of, for example, a cascade wall having a metering blade 35 extending therefrom. Wall 33 and metering blade 35 divide solution tray 27 into a first section 27*a* which includes solution tray entry port 29*a* and first solution tray exit port 29*b*; and a second section 27*b* which includes second solution tray exit port 31. Further, wall 33 and blade 35 control the height of solution within solution tray 27.

Coating apparatus 3 further includes a washing arrangement 40. Washing arrangement 40 includes a scrubber bar 40*a* having brushes 40*b* and a discharge opening 40*c* for supplying cleaning solution onto a surface of application roller 21. Washing arrangement 40 can be movable between a cleaning position as illustrated in FIG. 1A in which brushes 40*b* contact the surface of application roller 21, and a retracted position as illustrated in FIG. 1B in which the brushes 40*b* are spaced from a surface of application roller 21.

Coating apparatus 3 further includes a recirculation system 43 which includes a tank 45 for holding cleaning solution 8, such as water, and tank 9 which holds coating solution 7. Recirculation system 43 is adapted to alternately supply coating solution and/or cleaning solution to coating apparatus 3 in accordance with the mode of operation of coating apparatus 3. For this purpose, recirculation system 43 includes a first valve 47 which is located between tanks 45 and 9 and a pump 49. Valve 47 can be, but is not limited to, a three-way valve which includes a first position that is closed to cleaning solution tank 45 and opened to coating solution tank 9 for delivering coating solution to pump 49; and a second position which is closed to coating solution tank 9 and opened to cleaning solution tank 45 to deliver cleaning solution to pump 49. Recirculation system 43 further includes a second valve 51 which can be, but is not limited to, a two-way valve. Second valve 51 can be positioned so as to be closed during a coating mode of operation to prevent the application of coating solution from pump 49 to washing arrangement 40. Second valve 51 further can be positioned so as to be opened during a cleaning operation to permit the application of cleaning solution from pump 49 to washing arrangement 40. Recirculation system 43 further includes a third valve 53 located downstream of second exit port 31 of solution tray 27. Third valve 53 can be, but is not limited to, a three-way valve having a first position, during a coating operation, to direct coating solution from second exit port 31 to coating solution tank 9 and prevent the flow of coating solution to drain; and a second position, during a cleaning operation, which prevents the flow of cleaning solution from second exit port 31 to solution tank 9, and directs the flow of cleaning solution from second exit port 31 to drain. A fourth valve 54 which can be, but is not limited to, a two-way valve leads solution from first exit port 29*b* back to coating solution tank 9 or to drain via third valve 53 depending on the mode of operation of recirculation system 43. Thus, valve 54 has a first position which is closed to permit first section 27*a* of tank 27 to fill with solution, and a second position which is opened to drain or coating solution tank 9.

Therefore, during use of coating apparatus 3 in the coating mode, as indicated above, photosensitive material 5, such as processed photosensitive material, can be received at coating apparatus entry port 11. Photosensitive material 5 is transported emulsion side down via feed rollers 17 and squeegee rollers 19 to application roller 21. Further, recirculation system 43 will operate in the coating mode of operation. That is, first valve 47 will be closed to cleaning solution tank 45 and opened to coating solution tank 9. Thus, coating solution 7 will be pumped from tank 9 via pump 49 and delivered to line 100*a*. Second valve 51 will be placed in a position in which it prevents the supply of coating solution to washing arrangement 40. Thus, coating solution will flow along lines 100*a* and 100*c*, and enter solution tray 27 via solution tray entry port 29*a*. Fourth valve 54 will be closed so as to permit the coating solution to fill first section 27*a* of solution tray 27, such that application roller 21 is partially submerged in coating solution 7. Application roller 21 rotates in direction 60 as illustrated in FIG. 1B, such that application roller 21 will apply coating solution to photosensitive material 5, as photosensitive material 5 is transported emulsion side down onto application roller 21; and the coating solution is metered at nip portion 65 between drive roller 25 and application roller 21.

Further, in the coating mode of operation, washing arrangement 40 is moved to a retracted position. That is, washing arrangement 40 is moved so that brushes 40*b* are spaced away from the surface of application roller 21 as illustrated more clearly in FIG. 1B. Therefore, the travel of photosensitive material 5 to nip portion 65 will not be impeded by brushes 40*b* during the coating mode of operation.

In a feature of the present invention, solution tray 27 includes wall 33 and metering blade 35 as previously described. Metering blade 35 serves to abut against or be spaced from (depending on the amount of metering desired) a top surface of wire 23 of application roller 21, and thus, skim off excess coating solution from the surface of application roller 21. More specifically, metering blade 35 serves to abut against or be slightly spaced from the top surface of wire 23, so as to maintain the coating solution within spaces 23*a* between wire 23, and skim off unwanted excess coating solution that extends above the surface of wires 23.

In the system of the present invention, some coating solution will spillover into second section 27*b* of solution tray 27. Thus, second section 27*b* defines a spillover basin. This helps to control the height of solution in tank 27. This spillover coating solution will thereafter exit through second exit port 31, and be directed via third valve 53 to coating solution tank 9 for recycling. In the coating mode of operation, valve 53 is in a position in which it is closed to drain.

After the application of coating solution to photosensitive material 5, coated photosensitive material 5 is transported into path 250 to an exit 255. Thereafter, the coated photosensitive material is transferred to a dryer 260 via exit 255. Dryer 260 can be a dryer which dries photosensitive material 5 by way of, for example, air blowers as described in, for example, U.S. application Ser. Nos. 09/092,593 and 09/092,841.

In coating apparatus 3 as described above, the properties of the coating solution are such that the coating solution tends to harden over time. Eventually, components of the coating apparatus such as the rollers, guide blades and trays can become soiled and dirty with excess coating solution. This is especially troublesome with respect to dirty application rollers, which will tend to leave artifacts on the photosensitive material.

In the system of the present invention, recirculation system 43 can be changed from a coating mode of operation to a cleaning mode of operation. In the cleaning mode of operation, fourth valve 54 is opened, while third valve 53 remains closed to drain. This permits coating solution in first section 27*a* of solution tray 27 to be led to and recycled back to coating solution tank 9 via third valve 53. As an alternative, rather than recycling coating solution back to coating solution tank 9, valves 54 and 53 can be positioned to send coating solution to drain. After first section 27*a* of solution tray 27 is empty of coating solution, fourth valve 54 is closed and third valve 53 is open to drain. Thereafter, first valve 47 is positioned so as to be closed to coating solution tank 9 and opened to cleaning solution tank 45. Thus, pump 49 will pump cleaning solution into lines 100*a* and 100*c* and into entry port 29*a* of first section 27*a* of solution tank 27.

Further, second valve 51 is opened such that cleaning solution will travel along lines 100*b* and 100*d* to washing apparatus 40. Cleaning solution will be discharged from washing apparatus 40 via discharge opening 40*c*. An advantage of this arrangement is that an initial application of cleaning solution will help clean all the valves and lines, as well as pump 49. Further, the cleaning solution will help clean brushes 40*b* during an initial application of cleaning solution. During the cleaning mode, washing apparatus 40 is moved so that brushes 40*b* contact the surface of application roller 21 (FIG. 1A). In this mode, brushes 40*b* will tend to contact the top surface of wire 23, as well as be inserted into spaces 23*a* between wire 23. The combination of brushes 40*b* contacting the surface of application roller 21 (top surface of wire 23 and spaces 23*a* between wire 23), as well as the flow of cleaning solution onto application roller 21 will help to efficiently clean application roller 21. Further, cleaning solution applied via line 100*c* and entry port 29*a* into solution tray 27 will help clean solution tray 27. Additionally, flow of cleaning solution to other components of coating apparatus 3 serve to clean all components which come into contact with the cleaning solution.

As discussed above with respect to the coating solution, with fourth valve 54 closed, the cleaning solution fills up within first section 27*a* of solution tank 27 and will spill over the metering blade 35. This spill over cleaning solution will flow into second section 27*b* of solution tray 27. Solution which spillovers into second section 27*b* will exit at second exit port 31. As indicated above, valve 53 is closed to coating solution tank 9, so as to prevent the entry of cleaning solution into coating solution tank 9 and opened to drain to lead cleaning solution to drain. Therefore, with solution tray 27 filling with cleaning solution, application roller 21 can be cleaned by the combination of being immersed in the cleaning solution, as well as the application of cleaning solution via washing apparatus 40 and brushes 40*b*. After the components of coating apparatus 3 are substantially clean, fourth valve 54 is opened so as to lead cleaning solution from first section 27*a* of solution tray 27 to drain via first exit port 29*b*, fourth valve 54 and third valve 53. Once first section 27*a* of solution tray 27 is empty of cleaning solution, fourth valve 54 is closed, third valve 53 is opened to coating solution tank 9, and recirculation system 43 is operated in the coating mode as described above.

It is noted that the present invention is not limited to a single solution tray 27 divided into sections 27*a* and 27*b* as shown. It is noted that separate solution trays or solution holding areas can be adjacently positioned next to each other with one tray or holding area representing first section 27*a*; the other tray or holding area representing second section 27*b*; and metering blade 35 and wall 33 being positioned at the border between the first and second trays or holding areas.

Accordingly, the present invention provides for a coating apparatus that is capable of uniformly applying an even coating onto a surface of photosensitive material. The coating apparatus includes an efficient cleaning arrangement that can use the same recirculation system for both coating solution and cleaning solution, and effectively cleans the components of the coating apparatus.

Further, the use of recirculation system 43 and washing arrangement 40 as described above, is not limited to use with the specific coating apparatus described, and can be used with other coating apparatuses which utilize an application roller.

The invention has been described in detail with particular reference to certain preferred embodiments thereof, but it will be understood that variations and modifications can be effected within the spirit and scope of the invention.

What is claimed is:

1. A method of coating a photosensitive material with a coating solution, the method comprising the steps of:

locating an application roller at least partially within a solution tray of a coating apparatus, wherein a wall having a metering blade extending therefrom is provided in said tray, such that said metering blade extends to a surface of said application roller, and said wall and said metering blade are positioned in said tray so as to divide the tray into a first section and a second section which is separate from said first section and defines a spill-over basin;

supplying a coating solution to said first section of said solution tray such that said application roller is partially submerged in said coating solution;

metering the coating solution on said application roller with said metering blade, as said application roller is rotated while being at least partially submerged in said coating solution;

passing a photosensitive material through a nip between said application roller and a drive roller, said nip being downstream of said metering blade with respect to a direction of rotation of said application roller, such that the coating solution is applied to a surface of said photosensitive material as said photosensitive material passes through said nip; and catching coating solution from said first section which passes over said metering blade in said spill-over basin defined by the second section of said solution tray.

2. A method according to claim 1, comprising the further step of:

leading said coating solution caught in said spill-over basin to a coating solution tank for recycling back to said solution tray.

3. A method of coating a photosensitive material with a coating solution, the method comprising the steps of:

locating an application roller at least partially within a solution tray of a coating apparatus;

supplying a coating solution to said solution tray such that said application roller is partially submerged in said coating solution;

metering the coating solution on said application roller with a metering blade, as said application roller is rotated while being at least partially submerged in said coating solution;

passing a photosensitive material through a nip between said application roller and a drive roller, said nip being downstream of said metering blade with respect to a direction of rotation of said application roller, such that the coating solution is applied to a surface of said photosensitive material as said photosensitive material passes through said nip;

stopping the supply of coating solution to said solution tray; and supplying a cleaning solution to said solution tray and to a washing arrangement arranged relative to said application roller so as to supply cleaning solution onto at least a surface of said application roller, said washing arrangement having brushes extending therefrom.

4. A method according to claim 3, wherein said step of supplying cleaning solution to said solution tray and to at least said surface of said application roller comprises the step of positioning the washing arrangement so that said brushes touch the surface of said application roller.

5. A method according to claim 4, comprising the further steps of:

stopping the supply of said cleaning solution;

retracting said washing arrangement so that said brushes are spaced from the surface of said application roller; and resuming the supply of said coating solution.

* * * * *